US009685457B2

(12) United States Patent
Flachowsky et al.

(10) Patent No.: US 9,685,457 B2
(45) Date of Patent: Jun. 20, 2017

(54) METHOD INCLUDING A FORMATION OF A TRANSISTOR AND SEMICONDUCTOR STRUCTURE INCLUDING A FIRST TRANSISTOR AND A SECOND TRANSISTOR

(71) Applicant: GLOBALFOUNDRIES Inc., Grand Cayman (KY)

(72) Inventors: Stefan Flachowsky, Dresden (DE); Ralf Illgen, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/805,827

(22) Filed: Jul. 22, 2015

(65) Prior Publication Data

US 2017/0025442 A1    Jan. 26, 2017

(51) Int. Cl.
| *H01L 27/12* | (2006.01) |
| *H01L 29/66* | (2006.01) |
| *H01L 29/06* | (2006.01) |
| *H01L 21/3105* | (2006.01) |
| *H01L 21/308* | (2006.01) |

(Continued)

(52) U.S. Cl.
CPC .... *H01L 27/1207* (2013.01); *H01L 21/26513* (2013.01); *H01L 21/308* (2013.01); *H01L 21/31051* (2013.01); *H01L 21/324* (2013.01); *H01L 21/32139* (2013.01); *H01L 21/84* (2013.01); *H01L 29/0649* (2013.01);
(Continued)

(58) Field of Classification Search
CPC .......... H01L 27/1207; H01L 21/26513; H01L 21/308; H01L 21/31051; H01L 21/32139; H01L 21/324; H01L 21/84; H01L 29/0649; H01L 29/66545; H01L 29/66689; H01L 29/7816
See application file for complete search history.

(56) References Cited

U.S. PATENT DOCUMENTS

| 2011/0081774 | A1* | 4/2011 | Yeh | ............... H01L 21/82383 438/591 |
| 2011/0163383 | A1* | 7/2011 | Chou | ............... H01L 27/1207 257/351 |

(Continued)

*Primary Examiner* — Robert Huber
*Assistant Examiner* — Gardner W Swan
(74) *Attorney, Agent, or Firm* — Amerson Law Firm, PLLC

(57) ABSTRACT

A method includes providing a semiconductor-on-insulator structure including a semiconductor substrate, a layer of electrically insulating material over the semiconductor substrate and a layer of semiconductor material over the layer of electrically insulating material. A first transistor is formed. The formation of the first transistor includes forming a dummy gate structure over the layer of semiconductor material, forming a source region of the first transistor and a drain region of the first transistor in portions of the semiconductor substrate adjacent the dummy gate structure, forming an electrically insulating structure annularly enclosing the dummy gate structure and performing a replacement gate process. The replacement gate process includes removing the dummy gate structure and a portion of the layer of semiconductor material below the dummy gate structure, wherein a recess is formed in the electrically insulating structure. The recess is filled with an electrically conductive material.

18 Claims, 8 Drawing Sheets

(51) Int. Cl.
*H01L 21/3213* (2006.01)
*H01L 29/78* (2006.01)
*H01L 21/265* (2006.01)
*H01L 21/84* (2006.01)
*H01L 21/324* (2006.01)

(52) U.S. Cl.
CPC .. *H01L 29/66545* (2013.01); *H01L 29/66689* (2013.01); *H01L 29/7816* (2013.01)

(56) References Cited

U.S. PATENT DOCUMENTS

| | | | |
|---|---|---|---|
| 2011/0189825 A1* | 8/2011 | Heinrich | H01L 27/1207 438/151 |
| 2014/0312404 A1* | 10/2014 | Chou | H01L 27/1207 257/316 |

* cited by examiner

METHOD INCLUDING A FORMATION OF A TRANSISTOR AND SEMICONDUCTOR STRUCTURE INCLUDING A FIRST TRANSISTOR AND A SECOND TRANSISTOR

BACKGROUND OF THE INVENTION

1. Field of the Invention

Generally, the present disclosure relates to integrated circuits and methods for the formation thereof, and, more particularly, to integrated circuits including transistors that are adapted for operation at different voltages of operation and methods for the formation thereof.

2. Description of the Related Art

Integrated circuits typically include a large number of circuit elements which include, in particular, field effect transistors. In a field effect transistor, a gate electrode is provided. The gate electrode may be separated from a channel region of the field effect transistor by a gate insulation layer that provides electrical insulation between the gate electrode and the channel region. Adjacent the channel region, a source region and a drain region that may be doped differently than the channel region are provided. Depending on an electric voltage applied to the gate electrode, the field effect transistor can be switched between an ON-state and an OFF-state, wherein an electrical conductivity of the channel region in the ON-state is greater than an electrical conductivity of the channel region in the OFF-state.

Field effect transistors in integrated circuits can include logic transistors, which can be adapted for operation at a relatively low voltage of operation. Logic transistors can be adapted for providing a relatively small threshold voltage, relatively small leakage currents and/or a relatively high switching speed.

In addition to logic transistors, integrated circuits can include other types of field effect transistors that are adapted for use at a higher voltage of operation than logic transistors. Such high-voltage transistors can include input/output transistors that are used for handling an input to and/or an output of the integrated circuit and/or power transistors such as, for example, lateral double-diffused metal-oxide-semiconductor (LDMOS) transistors. Power transistors can be used, for example, in microwave and/or radio frequency amplifiers. In some applications, for example, radio frequency identification (RFID) tags and/or electrical components for use in mobile communication, it may be of advantage to provide both logic circuitry including logic transistors and microwave and/or radio frequency amplifiers including power transistors in the same integrated circuit.

For improving the performance of integrated circuits, it has been proposed to employ semiconductor-on-insulator technology. In semiconductor-on-insulator technology, a semiconductor-on-insulator structure is provided. The semiconductor-on-insulator structure includes a thin layer of semiconductor material, for example silicon, that is provided above a semiconductor substrate, for example a silicon wafer. The layer of semiconductor material is separated from the semiconductor substrate by a layer of electrically insulating material, for example silicon dioxide. Compared to integrated circuits wherein field effect transistors are formed on a bulk semiconductor substrate, semiconductor-on-insulator technology can allow reducing parasitic capacitances and leakage currents. Moreover, integrated circuits formed in accordance with semiconductor-on-insulator technology may be less sensitive with respect to ionizing radiation.

However, semiconductor-on-insulator technology can have some specific issues associated therewith, which include the so-called floating body effect. The body of a field effect transistor can form a capacitor with the insulated semiconductor substrate. In this capacitor, electric charge can accumulate and cause adverse effects, which may include a dependence of the threshold voltage of the field effect transistor on its previous states.

For substantially avoiding the floating body effect, it has been proposed to use fully depleted field effect transistors. Fully depleted field effect transistors are formed using a semiconductor-on-insulator structure, wherein the layer of semiconductor material provided on the electrically insulating layer has a smaller thickness than a channel depletion depth of the field effect transistor. Thus, the electric charge and, accordingly, the body potential of the field effect transistor can be fixed.

While fully depleted semiconductor-on-insulator technology can be of advantage for logic transistors, integrating fully-depleted logic transistors and high-voltage transistors in a same integrated circuit can have some issues associated therewith. Approaches according to the state of the art include providing LDMOS transistors in areas of a semiconductor structure wherein the layer of electrically insulating material and the layer of semiconductor material of the semiconductor-on-insulator structure are removed. Thus, LDMOS transistors can be provided in the form of bulk transistors. However, such approaches can require a relatively complicated processing.

Other approaches according to the state of the art include forming input/output transistors in accordance with semiconductor-on-insulator technology, wherein the input/output transistors include a thicker gate dielectric (which may be formed, for example, from silicon oxynitride) than the logic transistors. The logic transistors may include a relatively thin gate dielectric formed of a high-k material. However, the ability of such input/output transistors to withstand high voltages of operation may be limited.

Further approaches according to the state of the art include forming source, channel and drain regions of input/output transistors in the semiconductor substrate of the semiconductor-on-insulator structure and forming gate structures of the input/output transistors from the layer of electrically insulating material and the layer of semiconductor material of the semiconductor-on-insulator structure. In such approaches, the layer of electrically insulating material of the semiconductor-on-insulator structure can provide a gate insulation layer of the input/output transistors, and a gate electrode of the input/output transistors can be formed from the layer of semiconductor material of the semiconductor-on-insulator structure. However, the layout of such input/output transistors can differ substantially from classical transistor layouts, which may adversely affect the reliability of the transistors.

In view of the situation described above, the present disclosure relates to methods and systems that can help to avoid or at least reduce some or all of the above-mentioned issues.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor-on-insulator structure. The semiconductor-on-insulator structure includes a semiconductor substrate. A layer of electrically insulating material is provided over the semiconductor substrate. A layer of semiconductor material is provided over the layer of electrically insulating material. A first transistor is formed. The formation of the first transistor includes forming a dummy gate structure over the layer of semiconductor material, forming a source region of the first transistor and a drain region of the first transistor in portions of the semiconductor substrate adjacent the dummy gate structure, forming an electrically insulating structure annularly enclosing the dummy gate structure and performing a replacement gate process. The replacement gate process includes removing the dummy gate structure and a portion of the layer of semiconductor material below the dummy gate structure, wherein a recess is formed in the electrically insulating structure. The recess is filled with an electrically conductive material.

An illustrative semiconductor structure disclosed herein includes a semiconductor substrate, a layer of electrically insulating material over the semiconductor substrate, a layer of semiconductor material over the layer of electrically insulating material, a first transistor and a second transistor. The first transistor includes a first source region, a first channel region and a first drain region. The first source region, the first channel region and the first drain region are provided in the semiconductor substrate. The first transistor additionally includes a first portion of the layer of electrically insulating material over the first channel region. The first portion of the layer of electrically insulating material provides a first gate insulation layer. The first transistor further includes an electrically conductive first gate electrode over the first portion of the layer of electrically insulating material and one or more sidewall spacers adjacent the first gate electrode. The second transistor includes a second source region, a second channel region and a second drain region. The second source region, the second channel region and the second drain region are provided in the layer of semiconductor material. The second transistor additionally includes a second gate insulation layer over the second channel region and an electrically conductive second gate electrode over the second gate insulation layer. The second gate insulation layer and the second gate electrode are provided on a side of the layer of semiconductor material that is opposite a second portion of the layer of electrically insulating material below the second channel region.

BRIEF DESCRIPTION OF THE DRAWINGS

The disclosure may be understood by reference to the following description taken in conjunction with the accompanying drawings, in which like reference numerals identify like elements, and in which.

Figure 1:
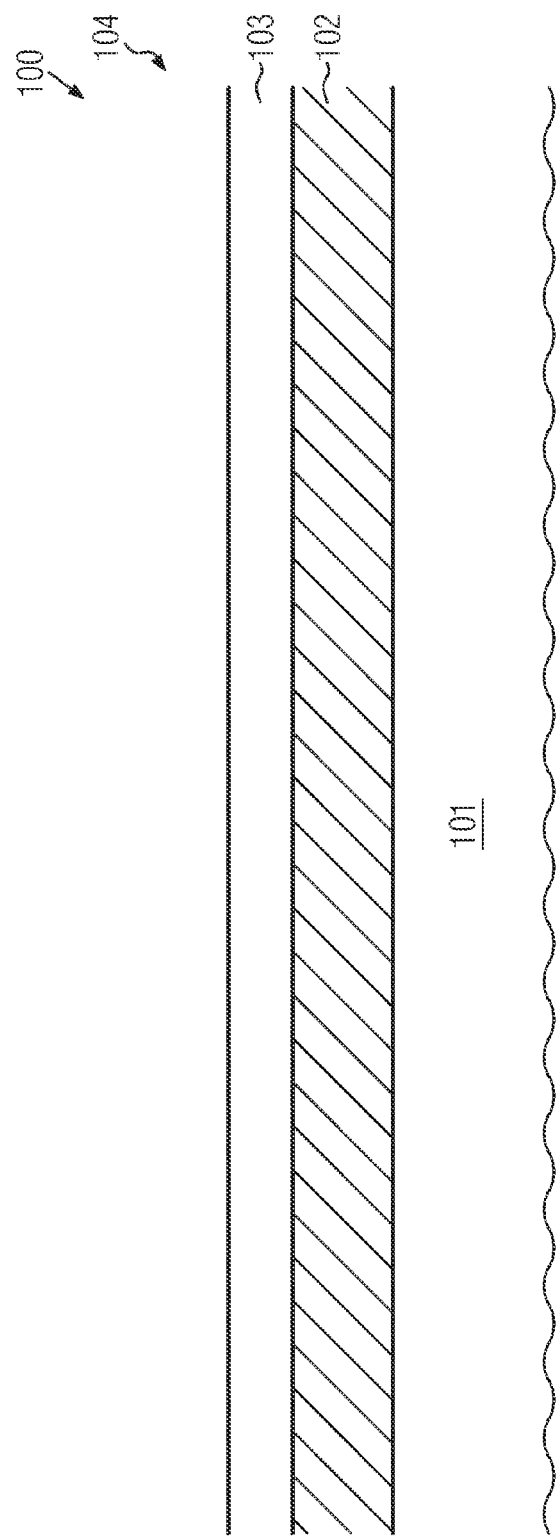
FIGS. 1-7 show schematic cross-sectional views of a semiconductor structure according to an embodiment in stages of a manufacturing process according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Embodiments disclosed herein can provide a robust high-voltage transistor which can be, for example, an input/output transistor or a laterally diffused metal oxide semiconductor (LDMOS) transistor in an integrated circuit wherein fully-depleted semiconductor-on-insulator technology is used without providing additional thick gate dielectrics. In one embodiment, an existing layer of electrically insulating material of a semiconductor-on-insulator structure, for example a buried oxide, can be used as a gate dielectric, with a gate electrode directly placed on top of the layer of electrically insulating material using a replacement gate process. In some embodiments, the high-voltage transistors can include a metal gate with edges protected by one or more sidewall spacers, similar to gate electrodes in classical transistor layouts. This can improve the reliability of the high-voltage transistors. Furthermore, high-voltage transistors as disclosed herein can withstand higher voltages than transistors wherein the source, drain and channel regions are formed in a layer of semiconductor material of a fully depleted semiconductor-on-insulator structure, and hot carrier injection properties and work functions can be optimized by adapting the gate length and using a dedicated metal for the high-voltage transistors.

FIG. 1 shows a schematic cross-sectional view of a semiconductor structure 100 according to one illustrative embodiment in a stage of a manufacturing process according to an embodiment. The semiconductor structure 100 includes a semiconductor substrate 101, which may include a wafer of a semiconductor material such as, for example, silicon. On the semiconductor substrate 101, a layer 102 of an electrically insulating material such as, for example, silicon dioxide may be provided. On the layer 102 of electrically insulating material, a layer 103 of a semiconductor material such as, for example, silicon may be provided. The semiconductor substrate 101, the layer 102 of electrically insulating material and the layer 103 of semiconductor material form a semiconductor-on-insulator structure 104. The layer 102 of electrically insulating material may provide a buried oxide (BOX) of the semiconductor-on-insulator structure 104.

In some embodiments, the semiconductor-on-insulator structure 104 may be a fully depleted semiconductor-on-insulator (FDSOI) structure that is suitable for the formation of fully depleted field effect transistors. In such embodiments, the layer 103 of semiconductor material may have a relatively small thickness in a range from about 5-12 nm.

The semiconductor-on-insulator structure 104 may be formed by means of known techniques for the formation of semiconductor-on-insulator structures, which may include techniques of oxidation, deposition and/or wafer bonding.

Figure 2:
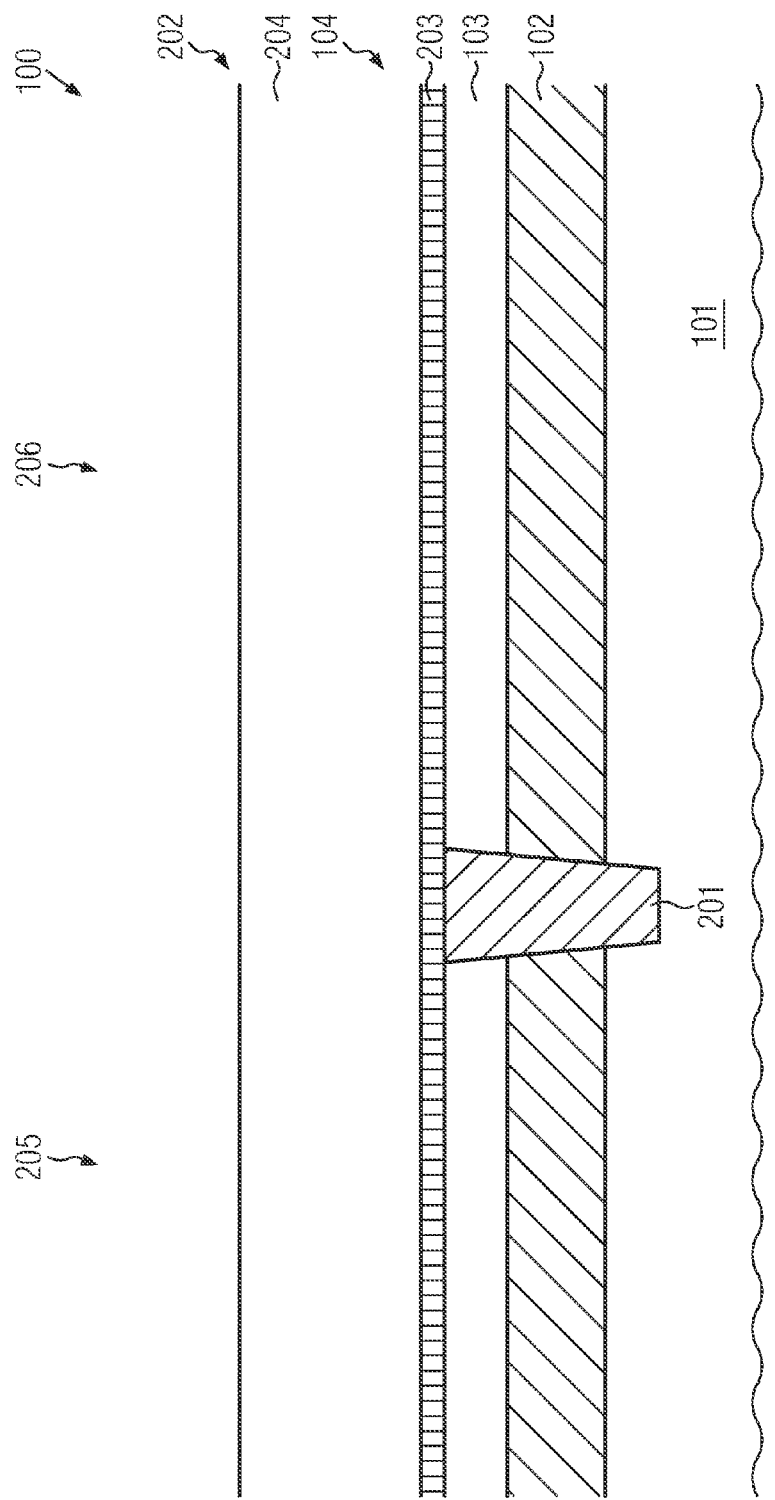

FIG. 2 shows a schematic cross-sectional view of the semiconductor structure 100 in a later stage of the manufacturing process. A trench isolation structure 201 may be formed. The trench isolation structure 201 may include a trench filled with an electrically insulating material such as silicon dioxide. The trench isolation structure 201 may extend through the layer 103 of semiconductor material and the layer 102 of electrically insulating material below the layer 103 of semiconductor material. Additionally, the trench isolation structure 201 may extend into the semiconductor substrate 101, as shown in FIG. 2. The trench isolation structure 201 may be formed using known techniques for the formation of shallow trench isolation structures, which may include photolithography, etching, oxidation, deposition and/or chemical mechanical polishing.

The trench isolation structure 201 may be arranged between a logic transistor region 205 and an input/output transistor region 206. In the schematic cross-sectional view of FIG. 2, the logic transistor region 205 is arranged at the left side of the trench isolation structure 201, and the input/output transistor region 206 is arranged at the right side of the trench isolation structure 201. As will be detailed in the following, in later stages of the manufacturing process, a logic transistor 220 (see FIG. 3) may be formed at the logic transistor region 205, and an input/output transistor 720 (see FIG. 7) may be formed at the input/output transistor region 206. The input/output transistor 720 formed at the input/output transistor region 206 may be adapted for operation at a higher voltage of operation than the logic transistor 220 formed at the logic transistor region 205. Therefore, the input/output transistor 720 will sometimes be denoted herein as a "high-voltage transistor." In some embodiments, the voltage of operation of the logic transistor 220 formed in the logic transistor region 205 may be in a range from about 0.6-1.0 V. The voltage of operation of the input/output transistor 720 formed in the input/output transistor region 206 may be in a range from about 1.5-3.8 V.

After the formation of the trench isolation structure 201, a gate stack 202 may be formed over the semiconductor-on-insulator structure 104. The gate stack 202 may include a layer 203 of a gate insulation material. In some embodiments, the layer 203 of gate insulation material may include a high-k material having a dielectric constant that is greater than a dielectric constant of silicon dioxide. In particular, the dielectric constant of the gate insulation material of the layer 203 may be greater than about 4. In some embodiments, the high-k material may include hafnium dioxide and/or zirconium dioxide. The layer 203 of gate insulation material need not be a substantially homogeneous layer. In some embodiments, the layer 203 of gate insulation material may include sublayers that are formed of different materials. For example, the layer 203 of gate insulation material may include a buffer layer of silicon dioxide that is provided directly on the layer 103 of semiconductor material and a layer of a high-k material that is provided on the buffer layer.

The layer 203 of gate insulation material may be formed using techniques of deposition such as chemical vapor deposition, plasma-enhanced chemical vapor deposition, physical vapor deposition and/or atomic layer deposition. In embodiments wherein the layer 203 of gate insulation material includes a buffer layer of silicon dioxide, the buffer layer may alternatively be formed by means of techniques of oxidation such as, for example, thermal oxidation.

The gate stack 202 may additionally include a layer 204 of a gate electrode material. The gate electrode material of the layer 204 may include a metal. In some embodiments, the metal may be selected for providing a suitable work function for the logic transistor 220 to be formed in the logic transistor region 205. In embodiments wherein the logic transistor 220 is a P-channel transistor, the layer 204 of gate electrode material may include aluminum and/or aluminum nitride. In embodiments wherein the logic transistor 220 is an N-channel transistor, the layer 204 of gate electrode material may include lanthanum, lanthanum nitride and/or titanium nitride.

The present disclosure is not limited to embodiments wherein the layer 204 of gate electrode material is a substantially homogeneous layer. In some embodiments, the layer 204 of gate electrode material may include sublayers of different materials, for example, a layer of a metal that is provided directly on the layer 203 of gate insulation material and a layer of a semiconductor material such as, for example, polysilicon, which may be doped, and may be provided on the metal layer.

For forming the layer 204 of gate electrode material, deposition techniques such as chemical vapor deposition, plasma-enhanced chemical vapor deposition and/or physical vapor deposition may be used.

The present disclosure is not limited to embodiments wherein the layer 203 of gate insulation material includes a high-k material and the layer 204 of gate electrode material includes a metal. In other embodiments, the layer 203 of gate insulation material may be a silicon dioxide layer, and the layer 204 of gate electrode material may be a semiconductor layer, for example, a layer of doped polysilicon that is formed directly on the silicon dioxide layer.

In some embodiments, the gate stack 202 may additionally include a capping layer (not shown), for example a silicon nitride layer, that is provided over the layer 204 of gate electrode material and may be formed using deposition techniques such as chemical vapor deposition and/or physical vapor deposition.

Figure 3:
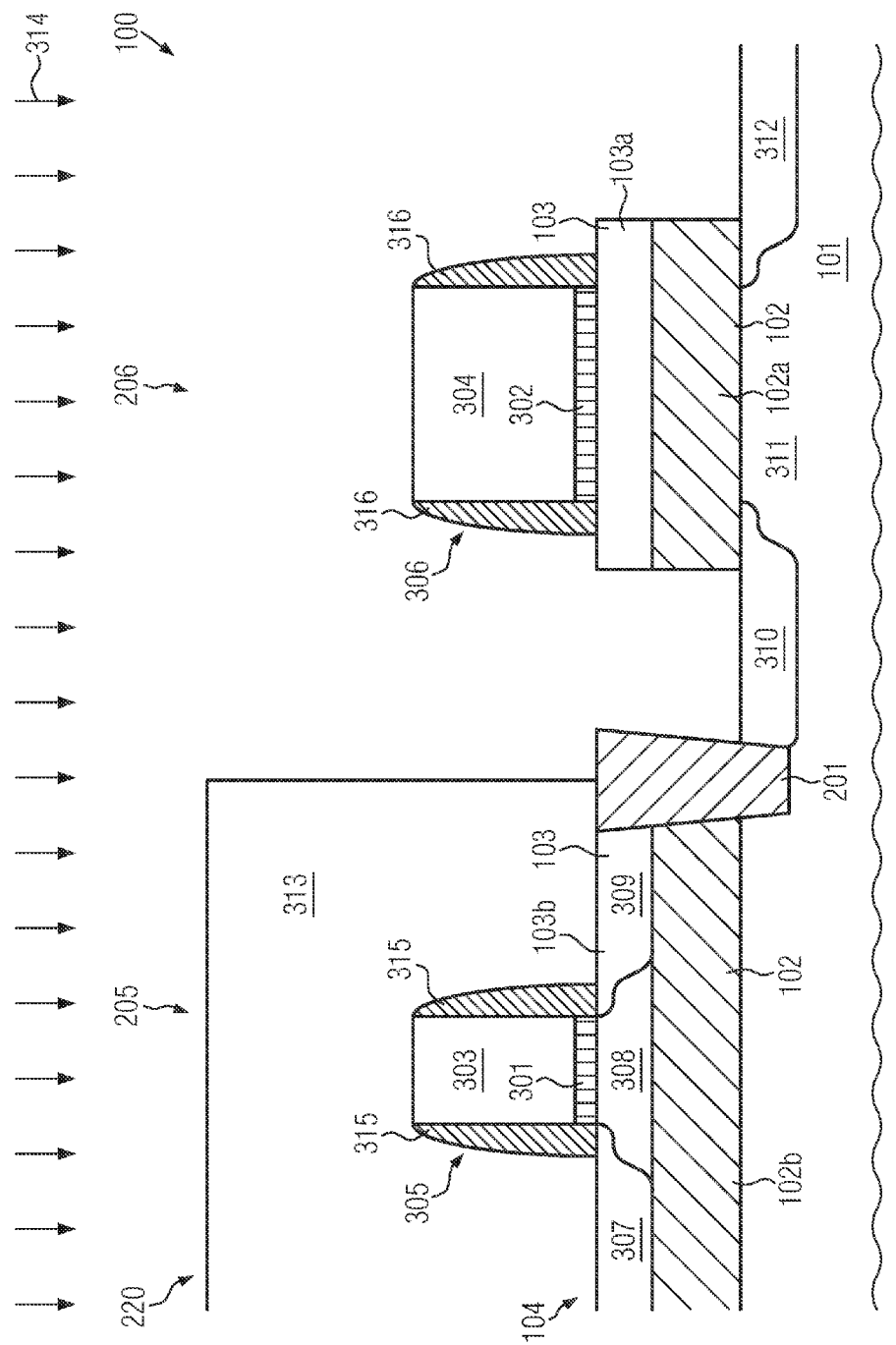

FIG. 3 shows a schematic cross-sectional view of the semiconductor structure 100 in a later stage of the manufacturing process. After the formation of the gate stack 202, the gate stack 202 may be patterned for forming a gate structure 305 of the logic transistor 220 and a dummy gate structure 306 of the input/output transistor 720 that is to be formed in the input/output transistor region 206.

The gate structure 305 of the logic transistor 220 includes a gate insulation layer 301 of the logic transistor 220 and a gate electrode 303 of the logic transistor 220. The gate insulation layer 301 is formed from a portion of the layer 203 of gate insulation material, and the gate electrode 303 is formed from a portion of the layer 204 of gate electrode material.

The dummy gate structure 306 of the input/output transistor 720 includes a dummy gate insulation layer 302 that is formed from a portion of the layer 203 of gate insulation material and a dummy gate electrode 304 that is formed from a portion of the layer 204 of gate electrode material. A length of the dummy gate structure 306, being an extension of the dummy gate structure 306 in a channel length direction (horizontal in the view of FIG. 3) may be greater than a length of the gate structure 305, being an extension of the gate structure 305 in the channel length direction, as shown in FIG. 3.

The gate structure 305 and the dummy gate structure 306 may be formed using techniques of photolithography and etching.

After the formation of the gate structure 305 and the dummy gate structure 306, sidewall spacers 315 and 316 may be formed adjacent the gate structure 305 and the dummy gate structure 306, respectively. This may be done by depositing a substantially conformal layer of a sidewall spacer material, for example silicon nitride, over the semiconductor structure 100. Techniques that allow for the deposition of a layer of sidewall spacer material include chemical vapor deposition and plasma-enhanced chemical vapor deposition. Thereafter, an anisotropic etch process, for example a dry etch process, may be performed for removing portions of the layer of sidewall spacer material over substantially horizontal portions of the semiconductor structure 100. Due to the anisotropy of the etch process, portions of the layer of sidewall spacer material at the sidewalls of the gate structures 305, 306 may remain in the semiconductor structure 100 and form the sidewall spacers 315, 316.

Adjacent the gate structure 305 at the logic transistor region 205, a source region 307 and a drain region 309 of the logic transistor 220 may be formed. The source region 307 and the drain region 309 may be provided in a portion 103b of the layer 103 of semiconductor material in the logic transistor region 205. The source region 307 and the drain region 309 may be formed by performing one or more ion implantation processes wherein ions of a dopant are introduced into the source region 307 and the drain region 309. Thus, the source region 307 and the drain region 309 may be differently doped than a channel region 308 between the source region 307 and the drain region 309 that is protected from an irradiation with ions of the dopant by the gate structure 305 and/or the sidewall spacer 315. In some embodiments, a first ion implantation process may be performed before the formation of the sidewall spacer 315 and a second ion implantation process may be performed after the formation of the sidewall spacer 315. Thus, a dopant profile at the interface between the source region 307 and the channel region 308 as well as a dopant profile at the interface between the channel region 308 and the drain region 309 may be controlled. An energy of the ions of the dopant that is used in the one or more ion implantation processes that are performed for forming the source region 307 and the drain region 309 of the logic transistor 220 may be adapted such that substantially no ions of the dopant are introduced into the semiconductor substrate 101.

In the input/output transistor region 206, a source region 310 and a drain region 312 of the input/output transistor 720 may be formed adjacent the dummy gate structure 306. The source region 310 and the drain region 312 may be formed in a portion of the semiconductor substrate 101 in the input/output transistor region 206.

For forming the source region 310 and the drain region 312 in the semiconductor substrate 101, portions of the layer 102 of electrically insulating material and the layer 103 of semiconductor material adjacent the dummy gate structure 306 may be removed by means of techniques of photolithography and etching. Thus, the semiconductor material of the semiconductor substrate 101 may be exposed adjacent the dummy gate structure 306. A portion 102a of the layer 102 of electrically insulating material and a portion 103a of the layer 103 of semiconductor material below the dummy gate structure 306 may remain in the semiconductor structure 100 at the stage of the manufacturing process shown in FIG. 3. As shown in FIG. 3, the portion 102a of the layer 102 of electrically insulating material and the portion 103a of the layer 103 of electrically insulating material may have a slightly greater extension along the channel length direction of the input/output transistor 720 than the dummy gate structure 306 flanked by the sidewall spacer 316. This may help to avoid an adverse influence of an etch process used to remove the portions of the layer 102 of electrically insulating material and the layer 103 of semiconductor material adjacent the dummy gate structure 306 on the dummy gate structure 306 and/or the sidewall spacer 316 in the case of a slight misalignment of a photomask that is provided over the dummy gate structure 306 and the sidewall spacer 316 during the etch process.

Thereafter, an ion implantation process may be performed for implanting ions of a dopant into the source region 310 and the drain region 312 of the input/output transistor 720 to be formed at the input/output transistor region 206, as schematically denoted by arrows 314 in FIG. 3. Ions impinging on the dummy gate structure 306 flanked by the sidewall spacer 316 may be absorbed so that substantially no ions of the dopant are introduced into a channel region 311 of the input/output transistor that is provided in the semiconductor substrate 101 below the dummy gate structure 306.

During the ion implantation process 314 that is performed for implanting ions of the dopant into the source region 310 and the drain region 312 of the input/output transistor 720, the logic transistor region 205 may be covered by a mask 313 so that substantially no ions are implanted into the logic transistor region 205. The mask 313 may be a photoresist mask, and it may be formed by means of a photolithography process.

In embodiments wherein the removal of the portions of the layer 102 of electrically insulating material and the layer 103 of semiconductor material adjacent the dummy gate structure 306 and the ion implantation process 314 for introducing ions of a dopant into the source region 310 and the drain region 312 of the input/output transistor 720 are performed after the formation of the source region 307 and the drain region 309 of the logic transistor 220 adjacent the gate structure 305, the input/output transistor region 206 need not be covered by a mask during the implantation of ions into the source region 307 and the drain region 309 of the logic transistor 220. As detailed above, ion implantation energies used in the implantation of dopant ions into the source region 307 and the drain region 309 of the logic transistor 220 may be adapted such that substantially no ions are implanted into the semiconductor substrate 101. Accordingly, in the input/output transistor region 206, ions are substantially only implanted into portions of the layer 103 of semiconductor material adjacent the dummy gate structure 306 that are removed later during the formation of the source region 310 and the drain region 312 of the input/output transistor 720.

In other embodiments, the input/output transistor region 206 may be covered by a mask (not shown), for example a photoresist mask, during the implantation of ions into the source region 307 and the drain region 309 of the logic transistor 220.

After the formation of the source regions 307, 310 and the drain regions 309, 312, the mask 313 may be removed by means of a resist strip process, and an activation anneal may be performed for activating the dopants introduced into the source regions 307, 310 and the drain regions 309, 312. Furthermore, in some embodiments, a silicide (not shown) may be formed in each of the source regions 307, 310 and the drain regions 309, 312. For this purpose, a layer of a metal, for example nickel, may be deposited over the semiconductor structure 100. This may be done by means of a physical vapor deposition process. Thereafter, one or more annealing processes may be performed for initiating a chemical reaction between the metal and the semiconductor material in the source regions 307, 310 and the drain regions 309, 312. Unreacted portions of the metal may be removed by means of an etch process.

Figure 4:
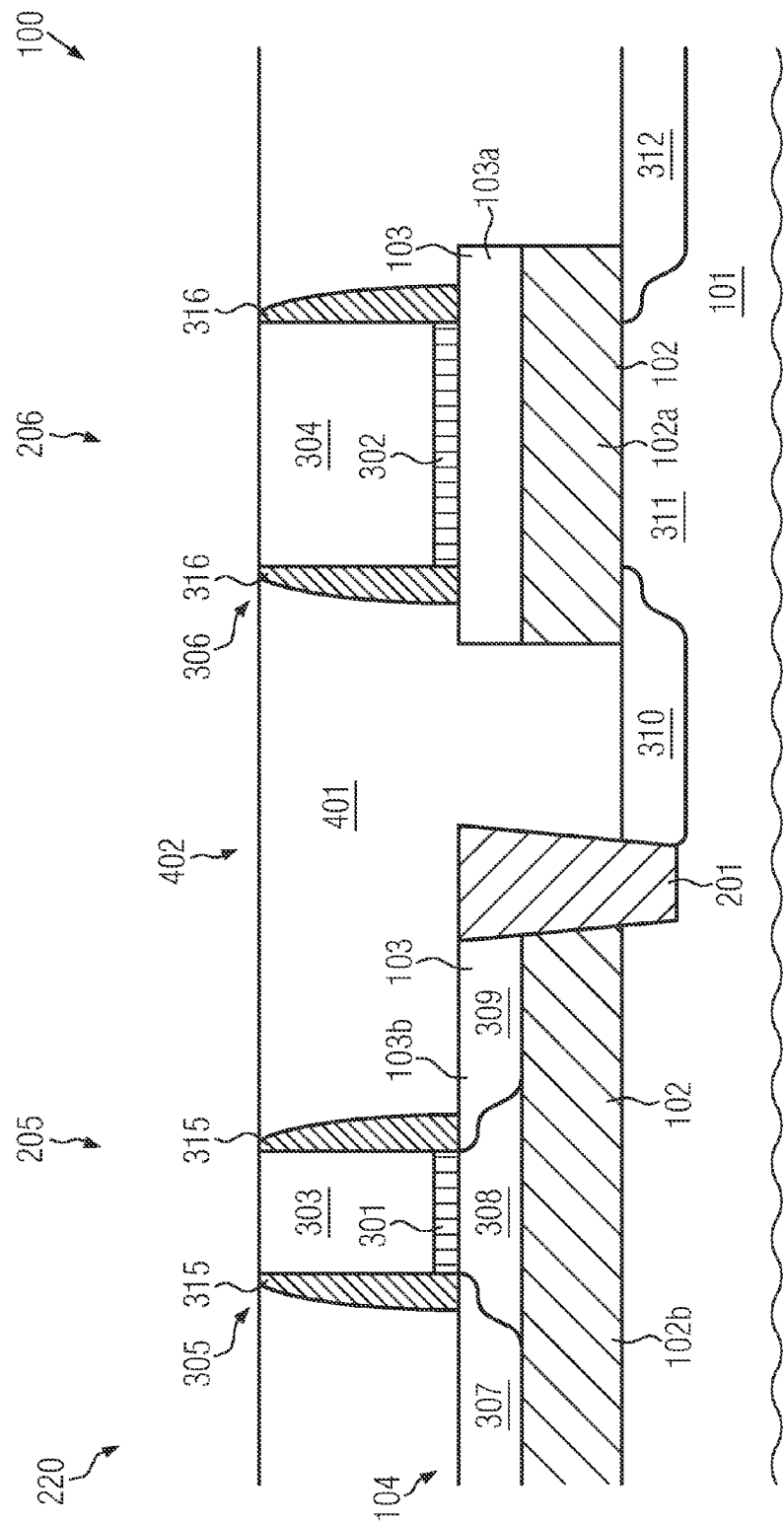

FIG. 4 shows a schematic cross-sectional view of the semiconductor structure 100 in a later stage of the manufacturing process. After the activation anneal for activating dopants in the source regions 307, 310 and the drain regions 309, 312 and/or the formation of silicide in the source regions 307, 310 and the drain regions 309, 312, an interlayer dielectric 401 may be deposited over the semiconductor structure 100. The interlayer dielectric 401 may include silicon dioxide, and it may be deposited by means of a chemical vapor deposition process and/or plasma-enhanced chemical vapor deposition process. The as-deposited interlayer dielectric 401 may cover the gate structure 305 in the logic transistor region 205 and the dummy gate structure 306 in the input/output transistor region 206. A topology of the surface of the as-deposited interlayer dielectric 401 may correspond to the topology of features of the semiconductor structure 100 therebelow. In particular, the surface of the as-deposited interlayer dielectric 401 may have bumps over the gate structure 305 and the dummy gate structure 306.

After the deposition of the interlayer dielectric 401, a polishing process, for example a chemical mechanical polishing process, may be performed. In the chemical mechanical polishing process, portions of the interlayer dielectric 401 over the gate structure 305 and the dummy gate structure 306 may be removed so that the gate electrode 303 and the dummy gate electrode 304 are exposed at the surface of the semiconductor structure 100. Moreover, a substantially planar surface of the semiconductor structure 100 may be obtained, as shown in FIG. 4.

The sidewall spacers 315, 316 and the interlayer dielectric 401 form an electrically insulating structure 402 that annularly encloses the gate structure 305 over the logic transistor region 205 and the dummy gate structure 306 over the input/output transistor region 306.

As detailed above, in some embodiments, the sidewall spacers 315, 316 may be formed of silicon nitride, and the interlayer dielectric 401 may include silicon dioxide. Accordingly, the electrically insulating structure 402 that is formed by the combination of the sidewall spacers 315, 316 and the interlayer dielectric 401 may include portions that are formed of different materials.

Figure 5:
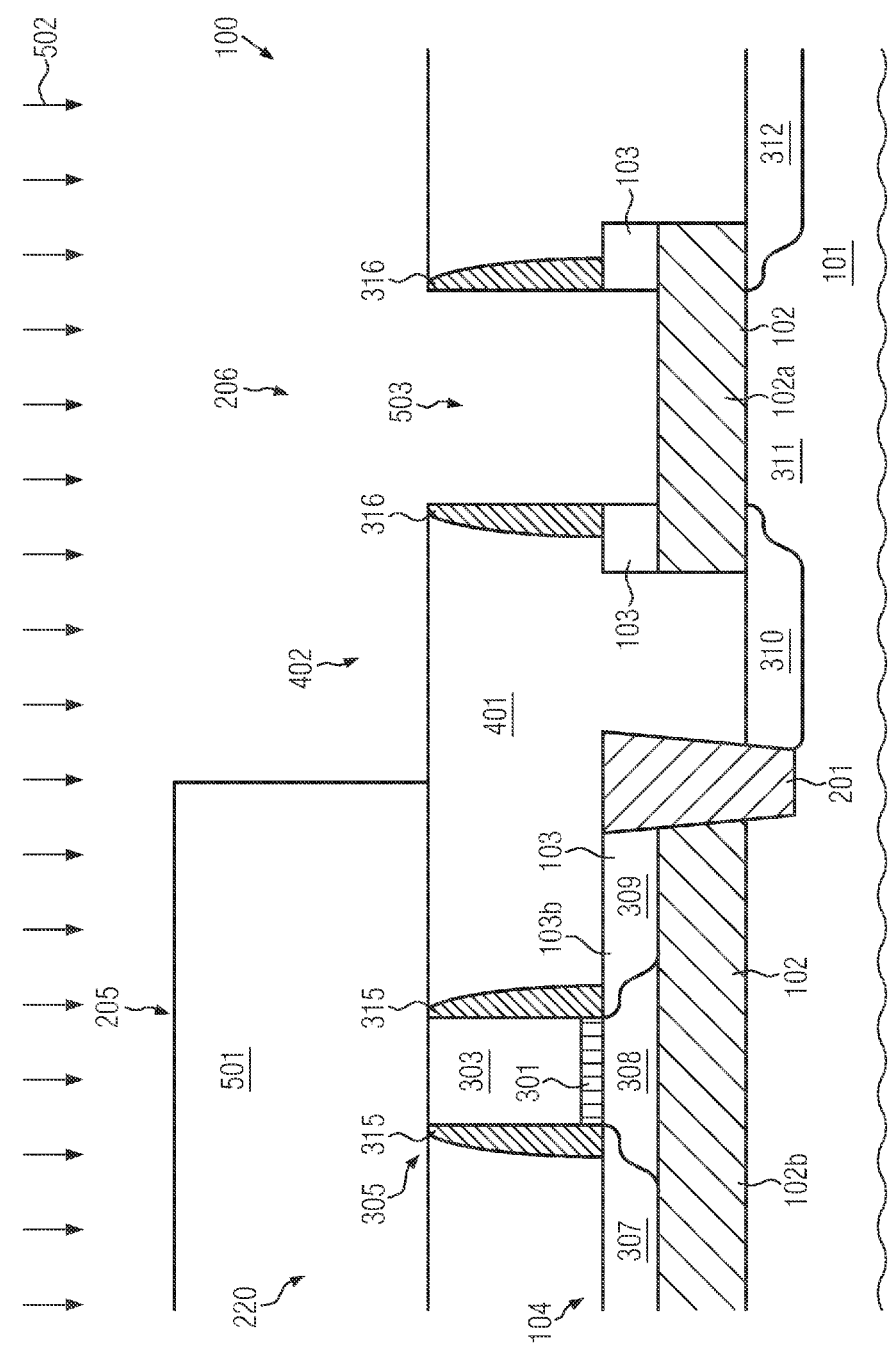

FIG. 5 shows a schematic cross-sectional view of the semiconductor structure 100 in a later stage of the manufacturing process. After the formation of the electrically insulating structure 402 that includes the sidewall spacers 315, 316 and the interlayer dielectric 401, a replacement gate process may be performed. For this purpose, a mask 501 that covers the logic transistor region 205 but not the input/output transistor region 206 may be formed over the semiconductor structure 100. In some embodiments, the mask 501 may be a photoresist mask, and it may be formed by means of a photolithography process. In other embodiments, the mask 501 may be a hardmask. In such embodiments, the mask 501 may be formed by depositing a layer of a hardmask material, for example silicon nitride, over the semiconductor structure 100. Thereafter, the layer of the hardmask material may be patterned by means of processes of photolithography and etching. In the patterning of the layer of hardmask material, a portion of the layer of hardmask material over the input/output transistor region 206 may be removed.

After the formation of the mask 501, one or more etch processes may be performed, as schematically illustrated by arrows 502 in FIG. 5. The one or more etch processes 502 may be adapted for selectively removing materials of the dummy gate electrode 304, the dummy gate insulation layer 302 and the layer 103 of semiconductor material relative to materials of the mask 501 and the electrically insulating structure 402. The one or more etch processes 502 may include one or more dry etch processes and/or one or more wet etch processes. In some embodiments, the one or more etch processes 502 may include a plurality of etch processes, wherein each of the plurality of etch processes is adapted for removing one material of the plurality of materials in the dummy gate electrode 304, the dummy gate insulation layer 302 and the layer 103 of semiconductor material.

In the one or more etch processes 502, a portion of the layer 103 of semiconductor material below the dummy gate structure 306 may be substantially completely removed so that the portion 102a of the layer 102 of electrically insulating material of the semiconductor-on-insulator structure is exposed at the surface of the semiconductor structure 100. The portion 102a of the layer 102 of electrically insulating material may remain in the semiconductor structure 100 and may provide a gate insulation layer of the input/output transistor 720 that is formed in the input/output transistor region 206.

In the one or more etch processes 502, the electrically insulating structure 402 may protect a part of the portion 103a of the layer 103 of semiconductor material in the input/output transistor region 206 from being affected by an etchant. Thus, semiconductor material from the layer 103 of semiconductor material between the portion 102a of the layer 102 of electrically insulating material and the sidewall spacer 316 and/or the interlayer dielectric 401 may remain in the semiconductor structure 100.

Due to the removal of the dummy gate structure 306 and the portion of the layer 103 of semiconductor material below the dummy gate structure 306, a recess 503 may be formed in the electrically insulating structure 402. The recess 503 is provided at substantially the same location as the dummy gate structure 306, and the recess 503 is annularly enclosed by the electrically insulating structure 402. At the bottom of the recess 503, the portion 102a of the layer 102 of semiconductor material may be exposed.

Figure 6:
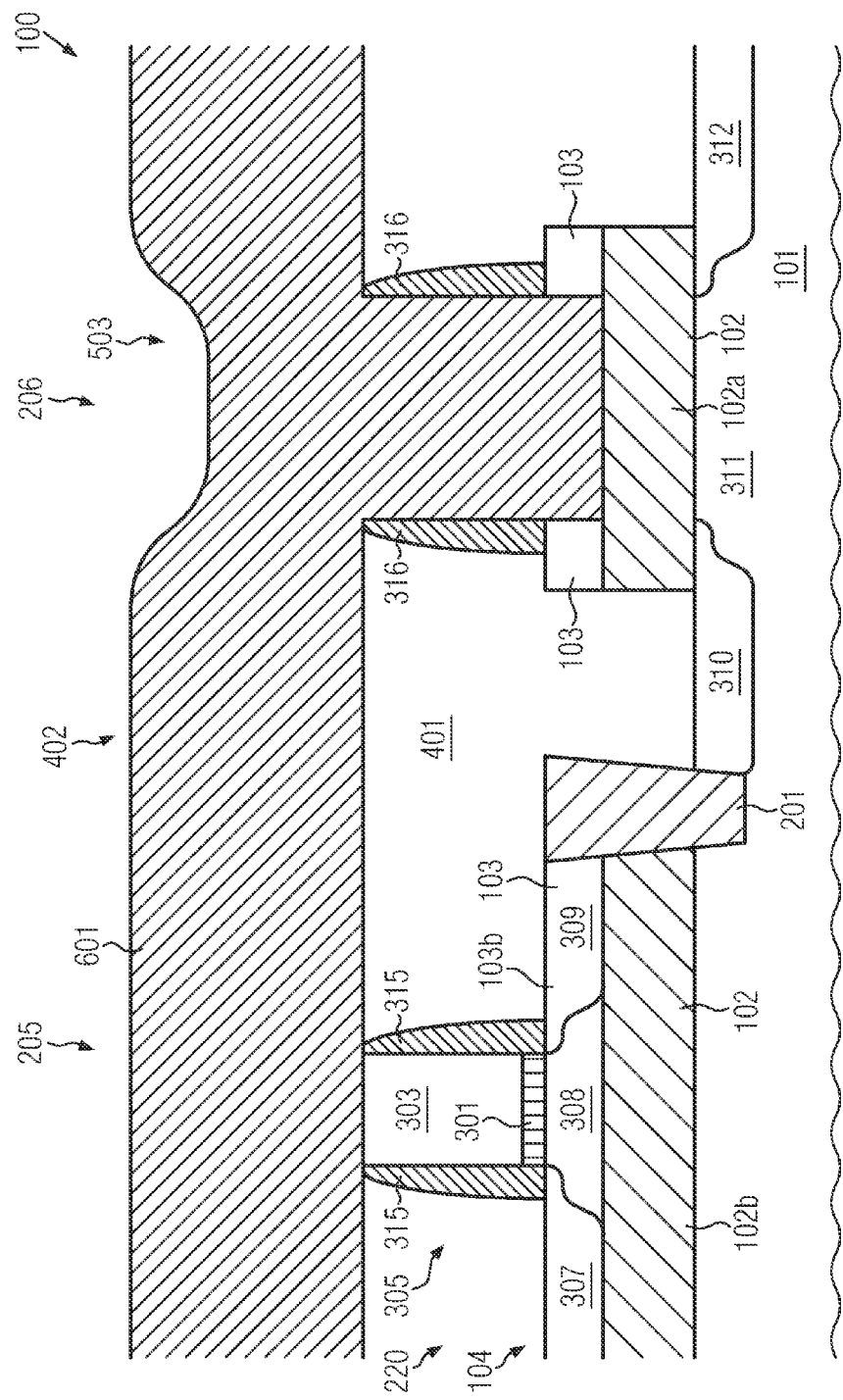

FIG. 6 shows a schematic cross-sectional view of the semiconductor structure 100 in a later stage of the manufacturing process. After the one or more etch processes 502, in some embodiments, the mask 501 may be removed. In embodiments wherein the mask 501 is a photoresist mask, this may be done by means of a resist strip process. In embodiments wherein the mask 501 is a hard mask, the mask 501 may be removed by means of an etch process adapted to selectively remove the material of the hard mask relative to other materials exposed at the surface of the semiconductor structure 100. In other embodiments wherein the mask 501 is a hard mask, the mask 501 may remain in the semiconductor structure 100 at the stage of the manufacturing process shown in FIG. 6, and it may be removed by means of a polishing process that will be described below with reference to FIG. 7.

A layer 601 of an electrically conductive material may be deposited over the semiconductor structure 100. In some embodiments, the layer 601 of electrically conductive material may include a metal such as, for example, aluminum and/or titanium nitride. In such embodiments, the layer 601 of electrically conductive material may be deposited by means of a physical vapor deposition process such as, for example, sputtering. Deposition processes other than sputtering such as, for example, chemical vapor deposition and/or plasma-enhanced chemical vapor deposition may also be used.

In other embodiments, the layer 601 of electrically conductive material may include doped polysilicon. In such embodiments, the layer 601 of electrically conductive material may be formed by means of chemical vapor deposition and/or plasma-enhanced chemical vapor deposition.

The layer 601 of electrically conductive material need not be a substantially homogeneous layer of metal or polysilicon. In further embodiments, the layer 601 of electrically conductive material may include layers of different materials. For example, the layer 601 of electrically conductive material may include a first sublayer including a metal that is deposited on the portion 102a of the layer 102 of electrically insulating material and the electrically insulating structure 402, and a second sublayer including doped polysilicon that is deposited on the first sublayer. In such embodiments, the metal of the first sublayer may be selected so as to have a workfunction that is suitable for the type of the input/output transistor 720 formed at the input/output transistor region 206. In embodiments wherein the input/output transistor 720 is a P-channel transistor, the metal of the first sublayer may include aluminum and/or aluminum nitride. In embodiments wherein the input/output transistor 720 is an N-channel transistor, the metal of the first sublayer may include lanthanum, lanthanum nitride and/or titanium nitride.

In still further embodiments, the layer 601 of electrically conductive material may include a first sublayer, which may include a metal selected in accordance with workfunction requirements that is provided on the portion 102a of the layer 102 of electrically insulating material and the electrically insulating structure 402, and a second sublayer including a metal other than the metal of the first sublayer that is provided on the first sublayer.

The layer 601 of electrically conductive material may be deposited directly on the portion 102a of the layer 102 of electrically insulating material at the bottom of the recess 503 and directly on the electrically insulating structure 402. In particular, the layer 601 of electrically insulating material may be deposited without performing a deposition of an electrically insulating material on the portion 102a of the layer 102 of electrically insulating material after the formation of the recess 503 and before the deposition of the layer 601 of electrically conductive material.

Figure 7:
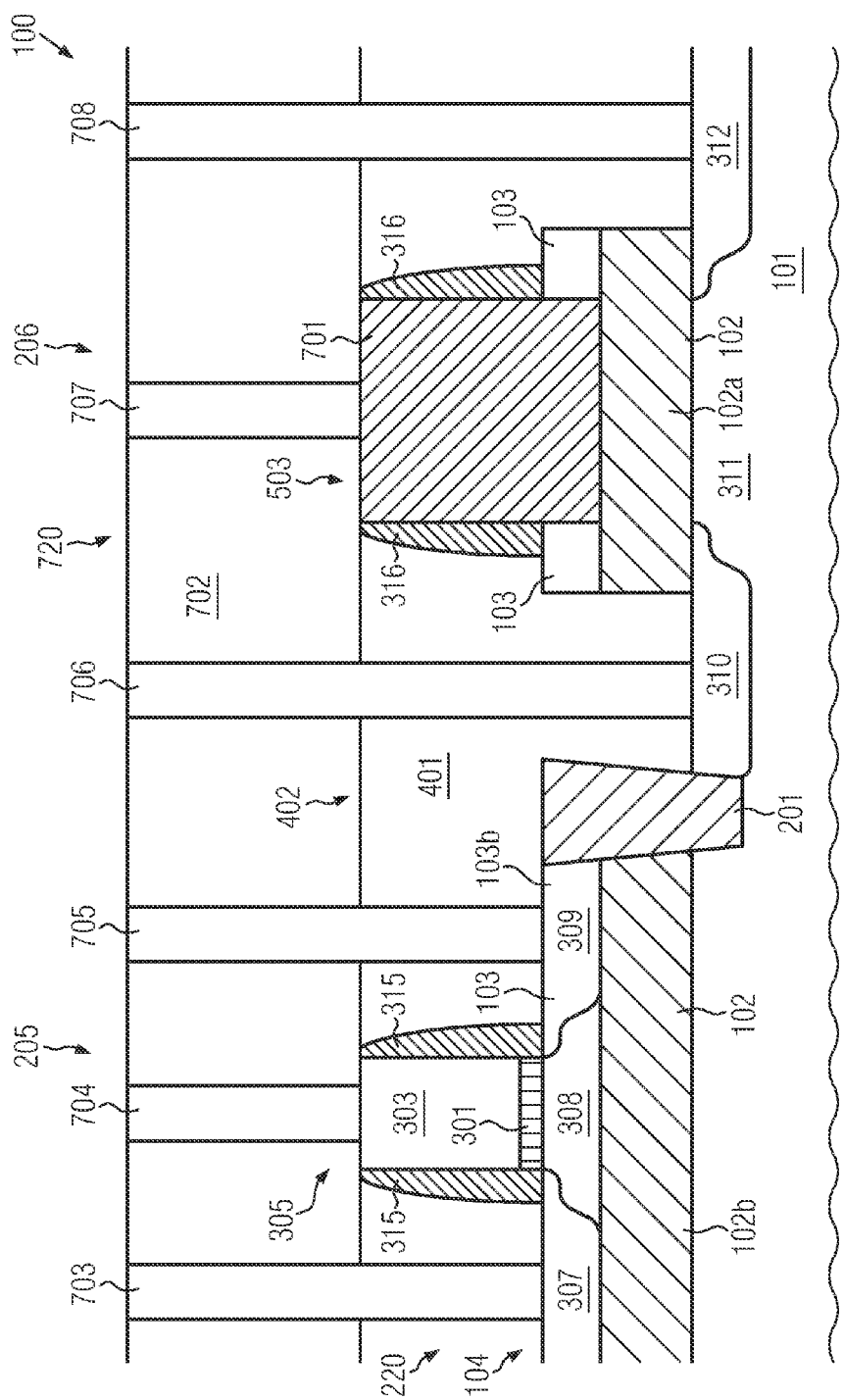

FIG. 7 shows a schematic cross-sectional view of the semiconductor structure 100 in a later stage of the manufacturing process. After the formation of the layer 601 of electrically conductive material, a polishing process, for example a chemical mechanical polishing process, may be performed for removing portions of the layer 601 of electrically conductive material outside the recess 503. In particular, the polishing process may remove portions of the layer 601 of electrically conductive material on a top surface of the electrically insulating structure 402 and on the gate structure 305 of the logic transistor 220. In embodiments wherein the mask 501 is still in the semiconductor structure 100, the polishing process may also remove the mask 501. Thus, after the polishing process, the interlayer dielectric 401 and the gate electrode 303 of the logic transistor 220 may be exposed at the surface of the semiconductor structure 100. The portion of the layer 601 of electrically conductive material in the recess 503 may provide a gate electrode 701 of the input/output transistor 720 formed in the input/output transistor region 206. In some embodiments, portions of the layer 103 of semiconductor material below the sidewall spacer 316 and/or over the portion 102a of the layer of electrically insulating material in the input/output transistor region 206 remaining in the semiconductor structure 100 may have an electrical contact to the gate electrode 701 and may provide extensions of the gate electrode 701. In the operation of the input/output transistor 720, such extensions of the gate electrode 701 may contribute to the electrical field created by the gate electrode 701 in the channel region 311 of the input/output transistor 720.

Thereafter, an interlayer dielectric 702 may be formed over the semiconductor structure 100. The interlayer dielectric 702 may include silicon dioxide or a low-k dielectric material such as, for example, a fluorosilicate glass, a carbon-doped silicon dioxide, a porous silicon dioxide, a porous carbon-doped silicon dioxide, a hydrogen silsesquioxane, a methylsilsesquioxane, a polyimide, a polynorbornene, a benzocyclobutene and/or a polytetrafluoroethylene. For forming the interlayer dielectric 702, a deposition process such as, for example, chemical vapor deposition, plasma-enhanced chemical vapor deposition and/or spin coating may be performed.

After the formation of the interlayer dielectric 702, electrical connections 703, 704, 705, 706, 707, 708 may be formed. The electrical connections 703, 704 and 705 may be connected to the source region 307, the gate electrode 303 and the drain region 309, respectively, of the logic transistor 220 in the logic transistor region 205. The electrical connections 706, 707 and 708 may be connected to the source region 310, the gate electrode 701 and the drain region 312, respectively, of the input/output transistor 720 in the input/output transistor region 206. The electrical connections 703 to 708 may be formed by forming contact holes extending through the interlayer dielectric 702 and/or the interlayer dielectric 401 and filling the contact holes with an electrically conductive material such as, for example, tungsten. This may be done in accordance with known techniques for providing electrical connections to field effect transistors in integrated circuits.

In the input/output transistor 720, the portion 102a of the layer 102 of electrically insulating material may provide a gate insulation layer between the gate electrode 701 and the channel region 311 of the input/output transistor 720. This gate insulation layer may have a greater thickness than the gate insulation layer 301 of the logic transistor 220, which may help to provide a greater breakthrough voltage of the gate insulation layer of the input/output transistor 720 as compared to the breakthrough voltage of the gate insulation layer 301 of the logic transistor 220. Thus, the input/output transistor 720 may be operated at a greater voltage of operation than the logic transistor 220.

The source region 310, the channel region 311 and the drain region 312 of the input/output transistor 720, which are provided in the semiconductor substrate 101, may provide a bulk configuration of the input/output transistor 720, which may be advantageous for a transistor that is operated at a relatively high operating voltage. The source region 307, the channel region 308 and the drain region 309 of the logic transistor 220 that are provided in the layer 102 of electrically insulating material may provide a semiconductor-on-insulator configuration of the logic transistor 220, for example, a fully-depleted semiconductor-on-insulator configuration. In the logic transistor 220, the gate insulation layer 301 and the gate electrode 303 are provided on a side of the layer 103 of semiconductor material that is opposite the portion 102b of the layer 102 of electrically insulating material below the channel region 308.

Figure 8:
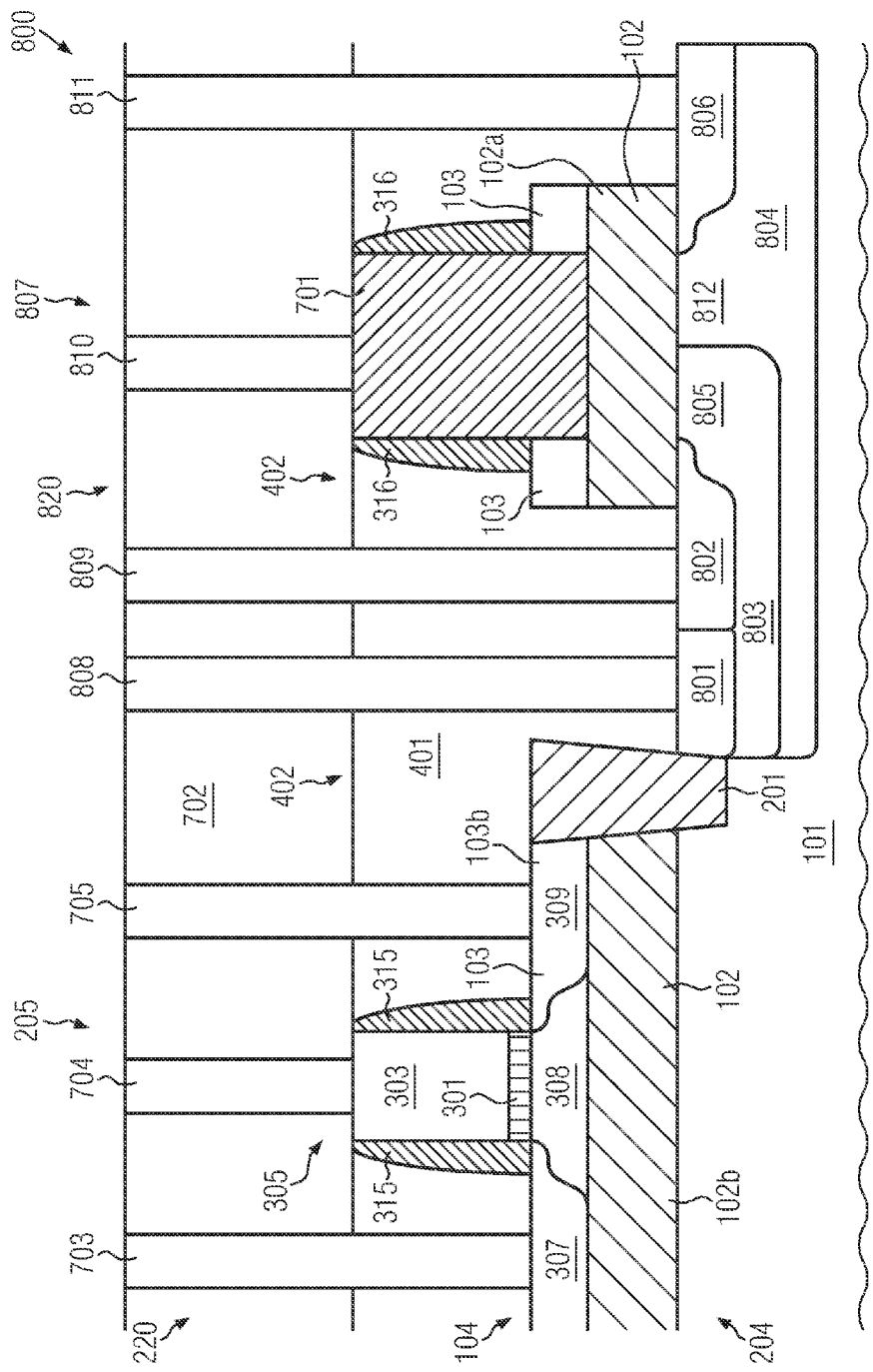
FIG. 8 shows a schematic cross-sectional view of a semiconductor structure according to an embodiment.

FIG. 8 shows a schematic cross-sectional view of a semiconductor structure 800 according to an embodiment. For convenience, in FIGS. 1-7, on the one hand, and in FIG. 8, on the other hand, like reference numerals have sometimes been used to denote like components. Unless explicitly indicated otherwise, components denoted by like reference numerals may have corresponding features, and substantially the same or similar methods may be employed for the formation thereof.

The semiconductor structure 800 includes a logic transistor 220 that is formed in a logic transistor region 205. The logic transistor 220 includes a source region 307, a channel region 308 and a drain region 309 that are provided in a portion 103b of a layer 103 of semiconductor material. The layer 103 of semiconductor material may be provided over a layer 102 of electrically insulating material. The layer 102 of electrically insulating material may be provided over a semiconductor substrate 101. The layer 103 of semiconductor material, the layer 102 of electrically insulating material and the semiconductor substrate 101 may provide a semiconductor-on-insulator structure 204.

The logic transistor 220 may further include a gate structure 305 that includes a gate insulation layer 301 and a gate electrode 303. The gate insulation layer 301 may include a high-k material, and the gate electrode 303 may include a metal. The gate insulation layer 301 and the gate electrode 303 may be provided on a side of the layer 103 of semiconductor material (above the layer 103 of semiconductor material in the view of FIG. 8) that is opposite a portion 102b of the layer 102 of electrically insulating material below the channel region 308 (below the layer 103 of semiconductor material in the view of FIG. 8).

Additionally, the semiconductor structure 800 may include an interlayer dielectric 401 and an interlayer dielectric 702. In the interlayer dielectrics 401, 702, electrical connections 703, 704, 705 may be formed. The electrical connections 703, 704 and 705 may be connected to the source region 307, the gate electrode 303 and the drain region 309, respectively, of the logic transistor 220.

The semiconductor structure 800 may further include a laterally diffused metal oxide semiconductor (LDMOS) transistor region 807. In the LMDOS transistor region 807, an LDMOS transistor 820 may be provided. A trench isolation structure 201 between the logic transistor region 205 and the LDMOS transistor region 807 may provide electrical insulation between the logic transistor 220 and the LDMOS transistor 820.

The LDMOS transistor 820 may include a gate electrode 701. Adjacent the gate electrode 701, a sidewall spacer 316 may be provided. The gate electrode 701 may be provided on, in particular, directly on, a portion 102a of the layer 102 of electrically insulating material of the semiconductor-on-insulator structure 204. The portion 102a of the layer 102 of electrically insulating material may provide a gate insulation layer of the LDMOS transistor 820 that is arranged between a channel region 805 of the LDMOS transistor 820 and the gate electrode 701. In some embodiments, below the sidewall spacer 316 and adjacent the gate electrode 701, portions of the layer 103 of semiconductor material, which may provide extensions of the gate electrode 701, may be provided.

The LDMOS transistor 820 may further include a source region 802 and a drain region 806 that are provided in the semiconductor substrate 101 adjacent the gate electrode 701 and on opposite sides of the channel region 805 of the LDMOS transistor 820. The source region 802 and the drain region 806 may have a doping of a first type in accordance with the type of the LDMOS transistor 820. In particular, in embodiments wherein the LDMOS transistor 820 is an N-channel transistor, the source region 802 and the drain region 806 may be N-doped. The channel region 805 of the LDMOS transistor 820 may be provided in a well region 803 that is doped oppositely to the doping of the source region 802 and the drain region 806. In embodiments wherein the LDMOS transistor 820 is an N-channel transistor, the well region 803 may be P-doped.

The LDMOS transistor 820 may further include a body contact region 801, which may be provided adjacent the source region 802 and may be doped oppositely to the doping of the source region 802 and the drain region 806. In embodiments wherein the LDMOS transistor 820 is an N-channel transistor, the body contact region 801 may be P-doped. The doping of the body contact region 801 may be of the same type as the doping of the well region 803. However, the body contact region 801 may have a higher dopant concentration than the well region 803. The well region 803 may extend below the body contact region 801 and the source region 802 so that the body contact region 801 may be electrically connected to the channel region 805 without there being a PN transition between the body contact region 801 and the channel region 805.

The LDMOS transistor 820 may further include a well region 804, which may extend below the well region 803 and the drain region 806. Additionally, the well region 804 may have a portion 812 that is arranged between the channel region 805 and the drain region 806 below the portion 102a of the layer 102 of electrically insulating material that provides the gate insulation layer of the LDMOS transistor 820. A type of doping of the well region 804 may correspond to the type of doping of the source region 802 and the drain region 806. In embodiments wherein the LDMOS transistor 820 is an N-channel transistor, the well region 804 may be N-doped. A dopant concentration in the well region 804 may be smaller than a dopant concentration in the drain region 806.

The portion 812 of the well region 804 may provide an extension of the drain region 806 below the gate electrode 701 so that an effective gate length of the LDMOS transistor 820, being an extension of the channel region 805 along the length direction of the LDMOS transistor 820 from the source region 802 to the drain region 806, may be smaller than a length of the gate electrode 701, being an extension of the gate electrode 701 in the length direction of the LDMOS transistor.

Further features of the source region 802, the drain region 806, the body contact region 801 and the well regions 803, 804 may correspond to features of source regions, drain regions, body contact regions and well regions in conventional bulk LDMOS transistors.

The semiconductor structure 800 may include electrical connections 808, 809, 810, 811, which may be provided in the interlayer dielectric 401 and the interlayer dielectric 702. The electrical connections 808, 809, 810 and 811 may be connected to the body contact region 801, the source region 802, the gate electrode 701 and the drain region 806, respectively, of the LDMOS transistor 820. Similar to the electrical connections 703, 704, 705, the electrical connections 808 to 811 may be provided by forming contact holes in the interlayer dielectrics 401, 702 and filling the contact holes with an electrically conductive material such as tungsten.

The semiconductor structure 800 may be formed using techniques as described above with reference to FIGS. 1-7, wherein some modifications may be made for forming the source region 802, the drain region 806, the body contact region 801 and the well regions 803, 804.

In particular, for forming the well regions 803, 804, ion implantations may be performed after providing the semiconductor-on-insulator structure 104 and forming the trench isolation structure 201. Masks, for example photoresist masks, may be used for protecting portions of the semiconductor structure 800 wherein no ions are to be implanted from an irradiation with ions during the respective ion implantation processes.

Thereafter, a gate stack similar to the gate stack 202 shown in FIG. 2 may be formed over the semiconductor structure 800. Thus, a configuration of the semiconductor structure 800 similar to the configuration of the semiconductor structure 100 shown in FIG. 2 may be obtained, wherein, in addition to the features shown in FIG. 2, the well regions 803, 804 are provided in the semiconductor structure 101.

Thereafter, the gate structure 305 of the logic transistor 220, the sidewall spacers 315, 316 and a dummy gate structure of the LDMOS transistor 820 having features similar to the dummy gate structure 306 of the input/output transistor 720 shown in FIG. 3 may be formed using techniques as described above with reference to FIG. 3, and ion implantation processes may be performed for forming the source region 307 and the drain region 309 of the logic transistor 220. Then, portions of the layer 102 of electrically insulating material and the layer 103 of semiconductor material over portions of the LDMOS transistor region 820 wherein the source region 802, the drain region 806 and the body contact region 801 are to be formed may be removed as described above with reference to FIG. 4. Then, ion implantation processes may be performed for introducing dopant ions into the source regions 802, the drain region 806 and the body contact region 801. In the implantation of ions into the source region 802 and the drain region 806, the body contact region 801 may be covered by a mask. In the implantation of ions into the body contact region 801, the source region 802 and the drain region 806 may be covered by a mask. The masks may be photoresist masks, and they may be formed by means of photolithography processes. Thus, the opposite type of doping of the source and drain regions 802, 806, on the one hand, and the body contact region 801, on the other hand, may be provided.

Thereafter, the processing of the semiconductor structure 800 may be continued as described above with reference to FIG. 4. In particular, the interlayer dielectric 401 may be deposited, and a planarization process may be performed for obtaining an electrically insulating structure 402 that annularly encloses the dummy gate structure of the LDMOS transistor 820, and a replacement gate process as described above with reference to FIGS. 5 and 6 may be performed for forming the gate electrode 701 of the LDMOS transistor 820. Thereafter, the interlayer dielectric 702 may be deposited, and the electrical connections 703 to 705, 808 to 811 may be formed in the interlayer dielectrics 401, 702.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method, comprising:
    providing a semiconductor-on-insulator structure comprising a semiconductor substrate, a layer of electrically insulating material over said semiconductor substrate and a layer of semiconductor material over said layer of electrically insulating material;
    forming a first transistor, the formation of said first transistor comprising:
        forming a dummy gate structure over said layer of semiconductor material;
        forming a source region of said first transistor and a drain region of said first transistor in portions of said semiconductor substrate adjacent said dummy gate structure;
        forming an electrically insulating structure annularly enclosing said dummy gate structure; and
        performing a replacement gate process to form a first gate structure of said first transistor, wherein said replacement gate process comprises:
            removing said dummy gate structure and a portion of said layer of semiconductor material below said dummy gate structure to form a recess in said electrically insulating structure; and
            filling said recess with an electrically conductive material; and
    forming a second transistor, the formation of said second transistor comprising:
        forming a second gate structure above said layer of semiconductor material; and
        forming a source region, a drain region and a channel region in said layer of semiconductor material, wherein said channel region is positioned below said second gate structure of said second transistor.

2. The method of claim 1, wherein said replacement gate process further comprises removing portions of said electrically conductive material formed outside said recess, a portion of said electrically conductive material in said recess forming at least a part of a gate electrode of said first transistor.

3. The method of claim 1, wherein forming said electrically insulating structure comprises:
    forming one or more sidewall spacers adjacent said dummy gate structure;
    depositing a layer of interlayer dielectric; and
    performing a polishing process wherein said dummy gate structure is exposed, portions of said one or more sidewalls spacers and said layer of interlayer dielectric that are not removed in said polishing process forming said electrically insulating structure.

4. The method of claim 3, wherein forming said source region and said drain region of said first transistor comprises:
    removing portions of said layer of electrically insulating material and said layer of semiconductor material adjacent said dummy gate structure; and
    performing an implantation of ions of a dopant into portions of said semiconductor substrate adjacent said dummy gate structure, wherein at least a part of said implantation of ions is performed after said formation of said one or more sidewall spacers and before said deposition of said layer of interlayer dielectric.

5. The method of claim 4, further comprising performing an activation anneal after said implantation of ions.

6. The method of claim 1, wherein removing said dummy gate structure and said portion of said layer of semiconductor material below said dummy gate structure comprises:
    forming a mask over said second transistor, wherein at least said dummy gate structure is not covered by said mask; and
    performing one or more etch processes adapted to selectively remove one or more materials of said dummy gate structure and said layer of semiconductor material relative to a material of said mask and one or more materials of said electrically insulating structure.

7. The method of claim 1, wherein said dummy gate structure and said gate structure of said second transistor are formed from a common gate stack.

8. The method of claim 1, wherein said second transistor is a logic transistor and said first transistor is a high-voltage transistor adapted for operation at a higher voltage of operation than said second transistor.

9. The method of claim 1, wherein said electrically conductive material comprises at least one of doped polysilicon and a metal.

10. The method of claim 1, wherein said first transistor is an input/output transistor.

11. The method of claim 1, wherein said first transistor is a laterally-diffused metal-oxide-semiconductor transistor.

12. A method, comprising:
    providing a semiconductor-on-insulator structure comprising a semiconductor substrate, a layer of electrically insulating material over said semiconductor substrate and a layer of semiconductor material over said layer of electrically insulating material;
    forming a first transistor, the formation of said first transistor comprising:
        forming a dummy gate structure over said layer of semiconductor material;
        forming a source region of said first transistor and a drain region of said first transistor in portions of said semiconductor substrate adjacent said dummy gate structure;
        forming an electrically insulating structure annularly enclosing said dummy gate structure; and
        performing a replacement gate process to form a first gate structure of said first transistor, wherein said replacement gate process comprises:
            forming a recess in said electrically insulating structure, wherein forming said recess comprises removing said dummy gate structure and a portion of said layer of semiconductor material below said dummy gate structure while leaving a portion of said electrically insulating material at a bottom of said recess; and
            filling said recess with an electrically conductive material; and
    forming a second transistor, the formation of said second transistor comprising:
        forming a second gate structure above said layer of semiconductor material; and
        forming a source region, a drain region and a channel region in said layer of semiconductor material, wherein said channel region is positioned below said second gate structure of said second transistor.

13. The method of claim 12, wherein filling said recess with said electrically conductive material comprises depositing said electrically conductive material directly on said portion of said layer of electrically insulating material left at said bottom of said recess.

14. The method of claim 12, wherein said portion of said layer of electrically insulating material left at said bottom of said recess provides a gate insulation layer of said first transistor.

15. The method of claim 12, wherein forming said electrically insulating structure comprises:
    forming one or more sidewall spacers adjacent said dummy gate structure;
    depositing a layer of interlayer dielectric above and around said dummy gate structure and said one or more sidewall spacers; and
    performing a polishing process on said layer of interlayer dielectric to expose said dummy gate structure, wherein portions of said one or more sidewall spacers and said layer of interlayer dielectric that are not removed during said polishing process form said electrically insulating structure.

16. The method of claim 15, wherein forming said source region and said drain region of said first transistor comprises:
    removing portions of said layer of electrically insulating material and said layer of semiconductor material adjacent said dummy gate structure; and
    performing an implantation process to implant dopant ions into portions of said semiconductor substrate adjacent said dummy gate structure, wherein at least a part of said implantation process is performed after forming said one or more sidewall spacers and before depositing said layer of interlayer dielectric.

17. The method of claim 16, further comprising performing an activation anneal after performing said implantation process.

18. The method of claim 12, wherein forming said recess further comprises:
    forming a mask over said second transistor, wherein at least said dummy gate structure is exposed by said mask; and
    performing one or more etch processes adapted to selectively remove one or more materials of said dummy gate structure and said layer of semiconductor material relative to a material of said mask and one or more materials of said electrically insulating structure.

* * * * *